(12) United States Patent
Miller

(10) Patent No.: US 6,181,164 B1
(45) Date of Patent: Jan. 30, 2001

(54) LINEAR FEEDBACK SHIFT REGISTER IN A PROGRAMMABLE GATE ARRAY

(75) Inventor: Andrew J. Miller, Walton-On-Thames (GB)

(73) Assignee: Xilinx, Inc., San Jose, CA (US)

( * ) Notice: Under 35 U.S.C. 154(b), the term of this patent shall be extended for 0 days.

(21) Appl. No.: 09/312,369

(22) Filed: May 13, 1999

(30) Foreign Application Priority Data

Jan. 8, 1999 (GB) .................................................. 9900432

(51) Int. Cl.[7] .................................................. H03K 19/173
(52) U.S. Cl. .................................. 326/46; 326/40; 326/41
(58) Field of Search .................................. 326/46, 40, 41, 326/37, 38, 39; 371/43.1, 37.7

(56) References Cited

U.S. PATENT DOCUMENTS 5,383,204 * 1/1995 Gibbs et al. ........................ 371/37.7
5,729,559 * 3/1998 Bright et al. ........................... 371/43
5,889,413 * 3/1999 Bauer ..................................... 326/40

OTHER PUBLICATIONS

"The Programmable Logic Data Book" published in 1998 by Xilinx, Inc., available from Xilinx Inc., 2100 Logic Drive, San Jose, California 95124.

Xilinx, Virtex TM Field Programmable Gate Array, Nov. 9, 1998 (Version 1.1—Advance), pp. 1–43.

* cited by examiner

*Primary Examiner*—David Nelms
*Assistant Examiner*—David Lam
(74) *Attorney, Agent, or Firm*—LeRoy D. Maunu; Edel M. Young

(57) ABSTRACT

A linear feedback shift register in a programmable gate array. A first lookup table is configured as a shift register having n selectable taps and a shift-input. A second lookup table is configured as a parity generator and has inputs coupled to the n selectable taps and an output coupled to the shift-input of the shift register.

20 Claims, 12 Drawing Sheets

LINEAR FEEDBACK SHIFT REGISTER IN A PROGRAMMABLE GATE ARRAY

REFERENCED PATENT APPLICATIONS

The present invention is related to the patent application entitled, "LOOKUP TABLES WHICH DOUBLE AS SHIFT REGISTERS," by Bauer, having serial number 08/754,421 and a filing date of Nov. 22, 1996, and assigned to the assignee of the present invention, which is herein incorporated by reference.

FIELD OF THE INVENTION

The present invention generally relates to linear feedback shift registers, and more particularly to a programmable gate array implementation of a linear feedback shift register.

BACKGROUND

Field programmable gate arrays (FPGAs), first introduced by XILINX in 1985, are becoming increasingly popular devices for use in electronics systems. For example, communications systems employ FPGAs in large measure for their re-programmability. In general, the use of FPGAs continues to grow at a rapid rate because they permit relatively short design cycles, reduce costs through logic consolidation, and offer flexibility in their re-programmability. The capabilities of and specifications for XILINX FPGAs are set forth in "The Programmable Logic Data Book," published in 1998 by XILINX, Inc., the contents of which is incorporated herein by reference.

Linear feedback shift registers (LFSRs) are commonly used in applications for generating pseudo-random noise sequences. The pseudo-random noise sequences are commonly referred to as "PN codes" or "PN sequences." Such noise sequences have a diverse range of uses, several of which are found in spread spectrum communications systems. The growing popularity of wireless communications systems has lead to the adoption of spread spectrum technology in an attempt to maximize utilization of the available radio signal bandwidth.

LFSR's are at the heart of every spread spectrum system as they are used to uniquely code each subscriber signal and spread the transmission signal across a wide range of frequencies. An LFSR generally comprises a shift register of one bit memory elements and an XOR feedback path. An LFSR can be achieved in both FPGA and ASIC technologies. However, it is always desirable to achieve a given functionality using the minimum number of resources since silicon resources of both ASICs and FPGAs are finite.

An example spread spectrum system, the Universal Mobile Telecommunication System (UMTS), requires a number of LFSRs that must be periodically set to a predefined state at a known time interval. The UTMS specification is controlled and maintained by the European Telecommunications Standards Institute (ETSI). This specification implies an LFSR structure that requires parallel access to all stages in the shift register such that the shift register's contents can be modified in one cycle of the LFSR clock rate. Implementing parallel access to the shift register stages requires additional logic resources, which is contrary to the objective of using as few resources as possible.

An apparatus that satisfies the aforementioned requirements, as well as other related requirements, is therefore desirable.

SUMMARY OF THE INVENTION

In various embodiments, the invention comprises a linear feedback shift register in a programmable logic device. A first lookup table is configured as a shift register having n selectable taps and a shift-input. A second lookup table is configured as a parity generator and has inputs coupled to the n selectable taps and an output coupled to the shift-input of the shift register.

In another embodiment, an n-stage linear feedback shift register with m taps is provided. The linear feedback shift register comprises m n-stage shift registers, m n:1 multiplexers, and a parity generator. The m n-stage shift registers each have n outputs and a respective data input. The m n:1 multiplexers have data inputs respectively coupled to the outputs of the n-stage shift registers, and each of the m n:1 multiplexers has $\log_2 n$ selection inputs, wherein the shift registers and multiplexers are implemented with respective look-up tables in the programmable gate array. The parity generator has inputs coupled to outputs of the multiplexers and an output coupled to the data inputs of the shift registers.

In another embodiment, an n-stage linear feedback shift register with m taps in a programmable gate array is provided. The linear feedback shift register comprises an n-stage shift register, an n:1 multiplexer, and a lookup table configured as an XOR function generator. The n-stage shift register has n outputs, a data input, and is operable at a first frequency at which data are shifted responsive to a first clock frequency. The n:1 multiplexer has data inputs respectively coupled to the outputs of the shift register, $\log_2 n$ selection inputs, and is operable at a second frequency at which the inputs are selectable responsive to a second clock frequency that is m× the first clock frequency. The shift register and multiplexer are implemented with a look-up table in the programmable gate array. The lookup table configured as an XOR function generator has a first input coupled to the output of the multiplexer, a second input, and an output coupled to the data input of the shift register. A flip-flop has a data input coupled to the output of the XOR function generator, an output coupled to the second input of the XOR function generator, and is clocked at the second clock frequency.

In other embodiments, Gold code generators are provided. A Gold code generator includes an additional XOR function generator that receives as input, output from the last stages of two linear feedback shift registers. The output of the XOR function generator provides the Gold code.

The above summary of the present invention is not intended to describe each disclosed embodiment of the present invention. The figures and detailed description that follow provide additional example embodiments and aspects of the present invention.

BRIEF DESCRIPTION OF THE DRAWINGS

Various aspects and advantages of the invention will become apparent upon review of the following detailed description and upon reference to the drawings in which.

Figure 1:
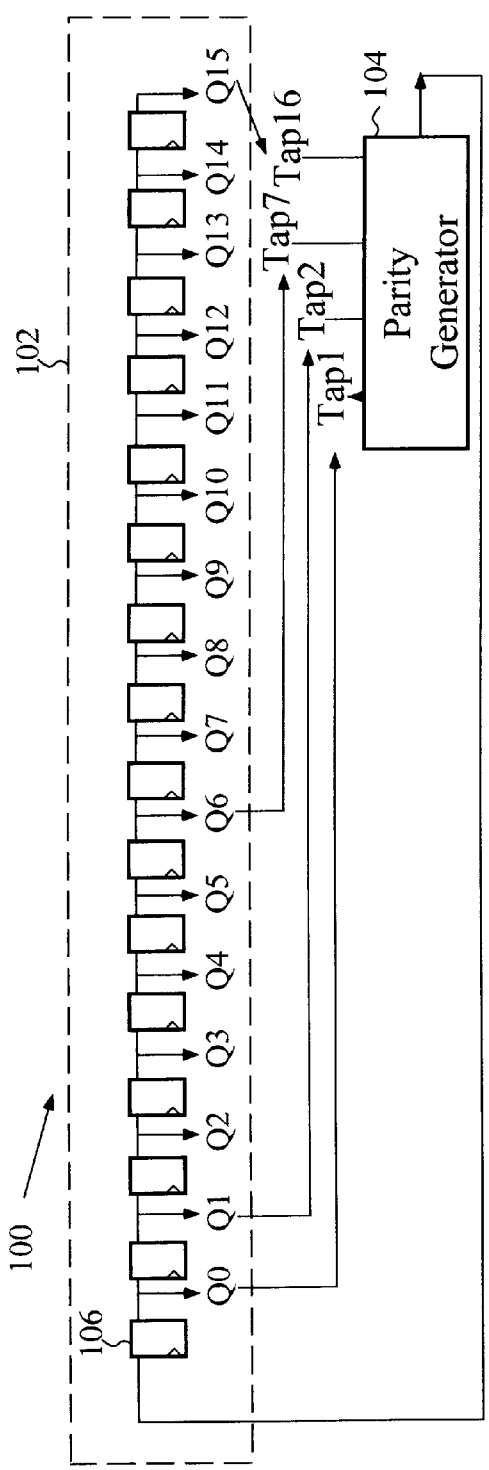
FIG. 1 is a functional block diagram that illustrates the operation of an example LFSR.

While the invention is susceptible to various modifications and alternative forms, specific embodiments thereof have been shown by way of example in the drawings and will herein be described in detail. It should be understood, however, that the detailed description is not intended to limit the invention to the particular forms disclosed. On the contrary, the intention is to cover all modifications, equivalents, and alternatives falling within the spirit and scope of the invention as defined by the appended claims.

DETAILED DESCRIPTION

The present invention is believed to be applicable to a variety of programmable gate arrays having various arrangements of configurable logic blocks comprising programmable LUTs and multiplexers of various sizes. The present invention has been found to be particularly applicable and beneficial for programmable gate arrays having 4-input LUTS, for example. While the present invention is not so limited, an appreciation of the present invention is presented by way of specific examples, in this instance, embodiments of the invention as applied to a programmable gate array having 4-input LUTs.

FIG. 1 is a functional block diagram that illustrates the operation of an example LFSR. An LFSR implementation generally depends upon several variables, including: the number of stages in the shift register, the number of taps in the feedback path, the positions of the taps relative to the stages of the shift register, and the initial state of the shift register.

The number of stages of the shift register is also referred to as the "length" or the "degree" of the shift register. In general, the longer the shift register the longer the duration before the sequence repeats. However, for a given length shift register, the number and position of taps also affects the repetition period of the sequence. For a shift register of length n, there will be many different combinations of taps and consequently varying lengths of periodic sequences.

The combination of taps and their locations is often referred to as a polynomial. An example polynomial is:

$$g(x)=1+X^3+X^7$$

where $X^3$ is the output of stage 3 of the shift register, and $X^7$ is the output of stage 7. The leading "1" represents the $X^0$ term, which is the input to the shift register from an XOR of the selected taps of the shift register. Thus, the input to the first stage of the shift register is the output of $X^3$ XOR $X^7$.

The last tap of the shift register in an LFSR is always used to generate the bit that is fed-back into the first stage of the shift register. Therefore, the length of the shift register can be deduced from the polynomial. For the example polynomial, $$g(x)=1+X^3+X^7,$$

the length of the shift register is 7.

The "fill state" defines at what point in a maximal length sequence the LFSR will start generating the subsequent states of that sequence. The UMTS specification requires that long maximal length sequences can be started from any point in an m-sequence and allowed to run for 10 ms before a new fill state is loaded. "Maximal length sequences" or "m-sequences" are understood by those skilled in the art, and for brevity will not be described herein. Thus, while not shown it will be understood that LFSR 100 includes circuitry for periodically initializing shift register 102.

The example LFSR 100 of FIG. 1 includes a 16-stage shift register 102 having stages designated as Q0, Q1, Q2, ..., Q15. Stages Q0, Q1, Q6, and Q15 are provided as taps 1, 2, 7, and 16 to parity generator 104. The example polynomial implemented by LFSR 100 is:

$$g(x)=1+X^1+X^2+X^7+X^{16}$$

Parity generator 104 implements the function:

((tap 1 XOR tap 2) XOR tap 7) XOR tap 16.

In an example implementation, the shift register is implemented with a plurality of flip-flops, and parity generator 104 is implemented with a programmable array lookup table having an output coupled to the input of first stage 106 of shift register 102.

Figure 2:
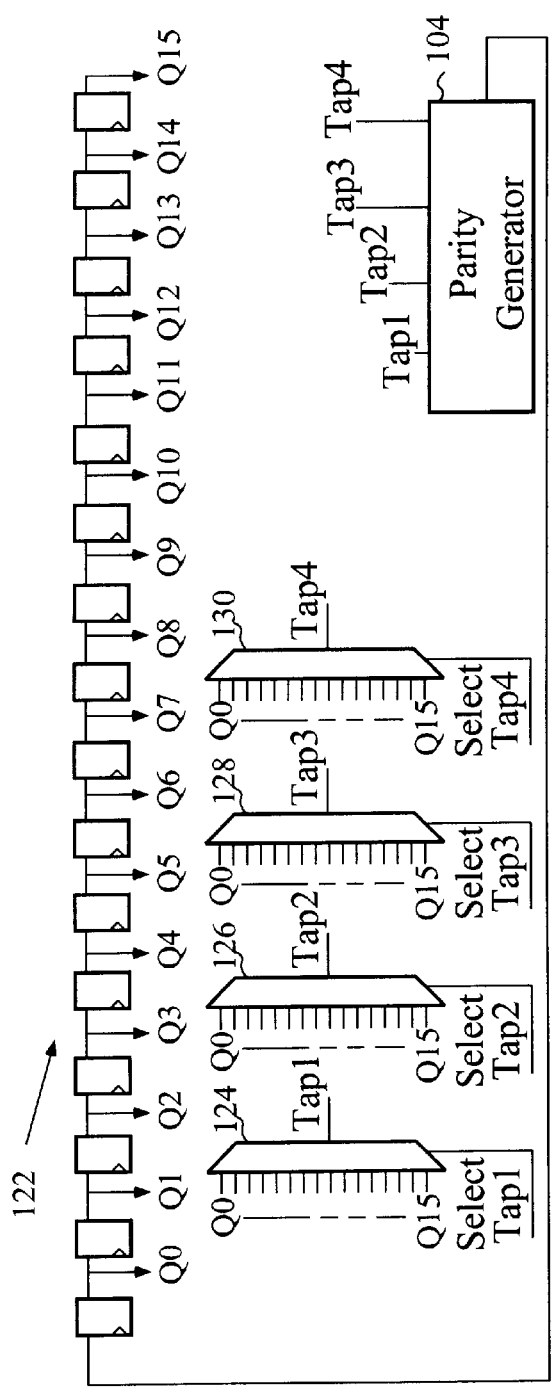
FIG. 2 is a functional block diagram that shows an LFSR with selectable taps.

FIG. 2 is a functional block diagram that shows LFSR 122 with selectable taps. LFSR 122 includes a shift register and parity generator as in FIG. 1, and in addition, includes a plurality of multiplexers 124, 126, 128, and 130. A multiplexer is provided for each desired tap, and the outputs of the multiplexers are coupled to the inputs of parity generator 104. Respective sets of selection signals are provided to the select inputs of the multiplexers. In a programmable gate array embodiment, the selection signals can be programmable, thereby providing the capability to implement a different polynomial if desired.

Figure 3:
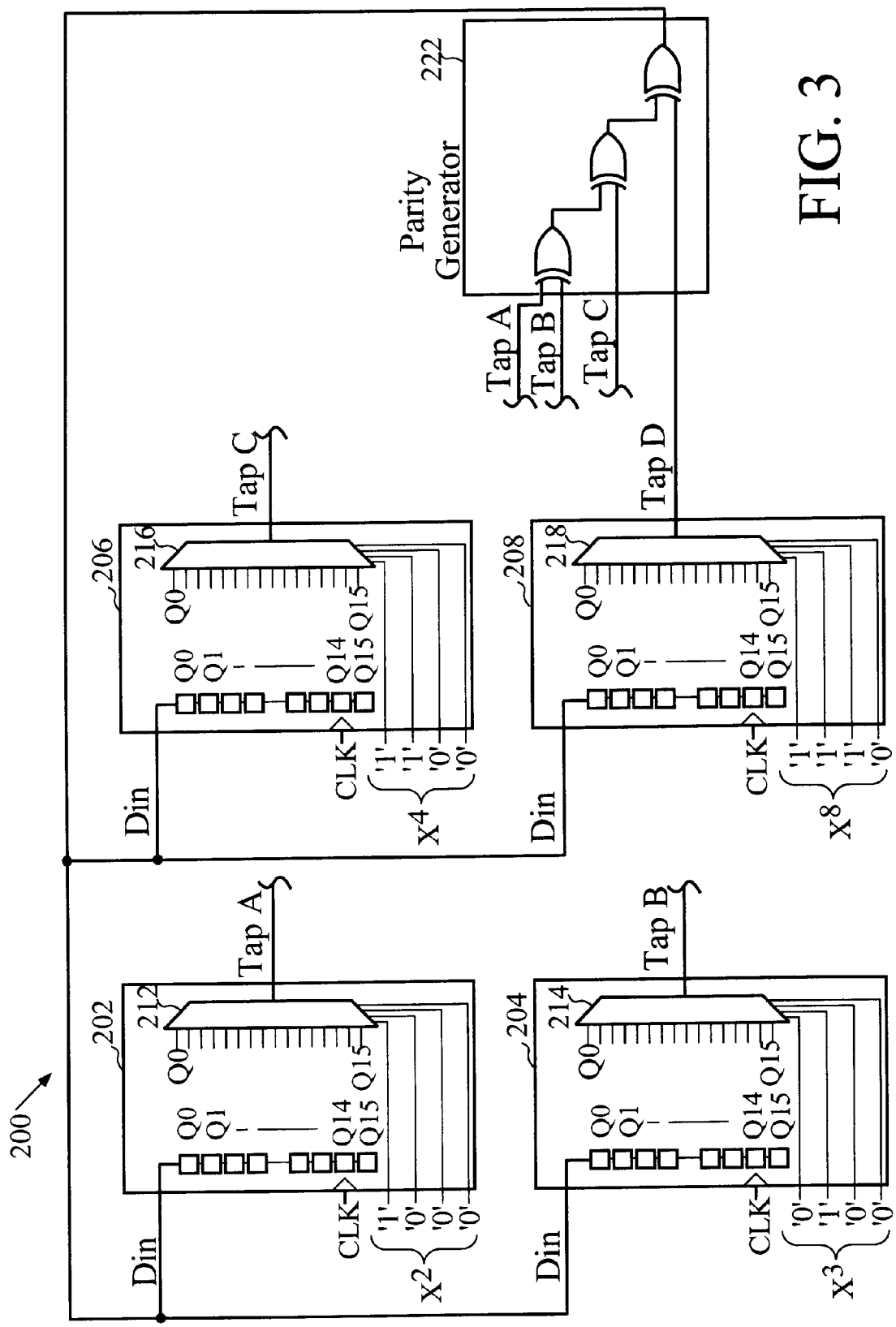
FIG. 3 illustrates an implementation of an example 8-stage LFSR in accordance with an example embodiment of the invention.

FIG. 3 illustrates an implementation of an example 8-stage LFSR 200 in accordance with an example embodiment of the invention. The example polynomial is:

$$g(x)=1+X^2+X^3+X^4+X^8$$

Note that since the degree of the polynomial is 8, and since 4-input LUTs having 16-stage shift registers are used, the last 8 stages of the 16-stage shift registers are not used.

LFSR 200 includes respective shift registers 202, 204, 206, and 208 for the taps selected for the polynomial. In the example embodiment, shift registers 202–208 are implemented in accordance with the teachings of the co-pending patent application by Bauer entitled, "LOOKUP TABLES WHICH DOUBLE AS SHIFT REGISTERS," having serial number 08/754,421 and a filing date of Nov. 22, 1996, which is herein incorporated by reference. Thus, for example, shift registers 202–208 are implemented using 4-input LUTs, and the shift registers may also be referred to as "4-LUTs." Shift register 202 provides the $X^2$ term, shift register 204 provides the $X^3$ term, shift register 206 provides the $X^4$ term, and shift register 208 provides the $X^8$ term.

LUTs 202–208 include respective multiplexers 212, 214, 216, and 218. Each multiplexer has data inputs coupled to the stages of the respective shift register and selection inputs arranged to receive selection signals. For example, multiplexer 212 has data inputs coupled to the stages Q0–Q15 of the shift register 202. Since LUT 202 implements the $X^2$ term, the selection bits are "0001" (the $X^2$ term corresponds to the stage Q1).

LUTs 202–208 also have CLK inputs, wherein the CLK signal controls the shifting of data through the shift registers. The outputs of LUTs 202–208 are coupled to the inputs of parity generator 222, which implements a series of XOR gates as shown and which can be implemented with a 4-LUT. The output of parity generator 222 is coupled to the data inputs of the first stages Q0 of instances 202–208 of the shift register.

Thus in one example embodiment of an LFSR, the shift register is replicated n times, where n is the number of taps required for the polynomial, assuming that one instance of a shift register can be implemented with one LUT. In the Virtex FPGA from XILINX, a 16-stage shift register can be implemented with a 4-input LUT. The Virtex FPGA is described on pages 3–3 through 3–31 of the 1999 Xilinx Programmable Logic Data Book. Information in this document is incorporated herein by reference. Permanent copies of this document are available from Xilinx, Inc, at 2100 Logic Drive, San Jose, Calif. 95124.

The example embodiment of FIG. 3 could be extended to include more than 4 taps if desired. Specifically, for each additional tap of the implemented shift register, an additional instance of a LUT-implemented shift register would be required along with additional programmable selection signals. The parity generator would also need to be extended, for example with additional LUTs, to include an additional XOR functions for the additional taps.

Figure 8:
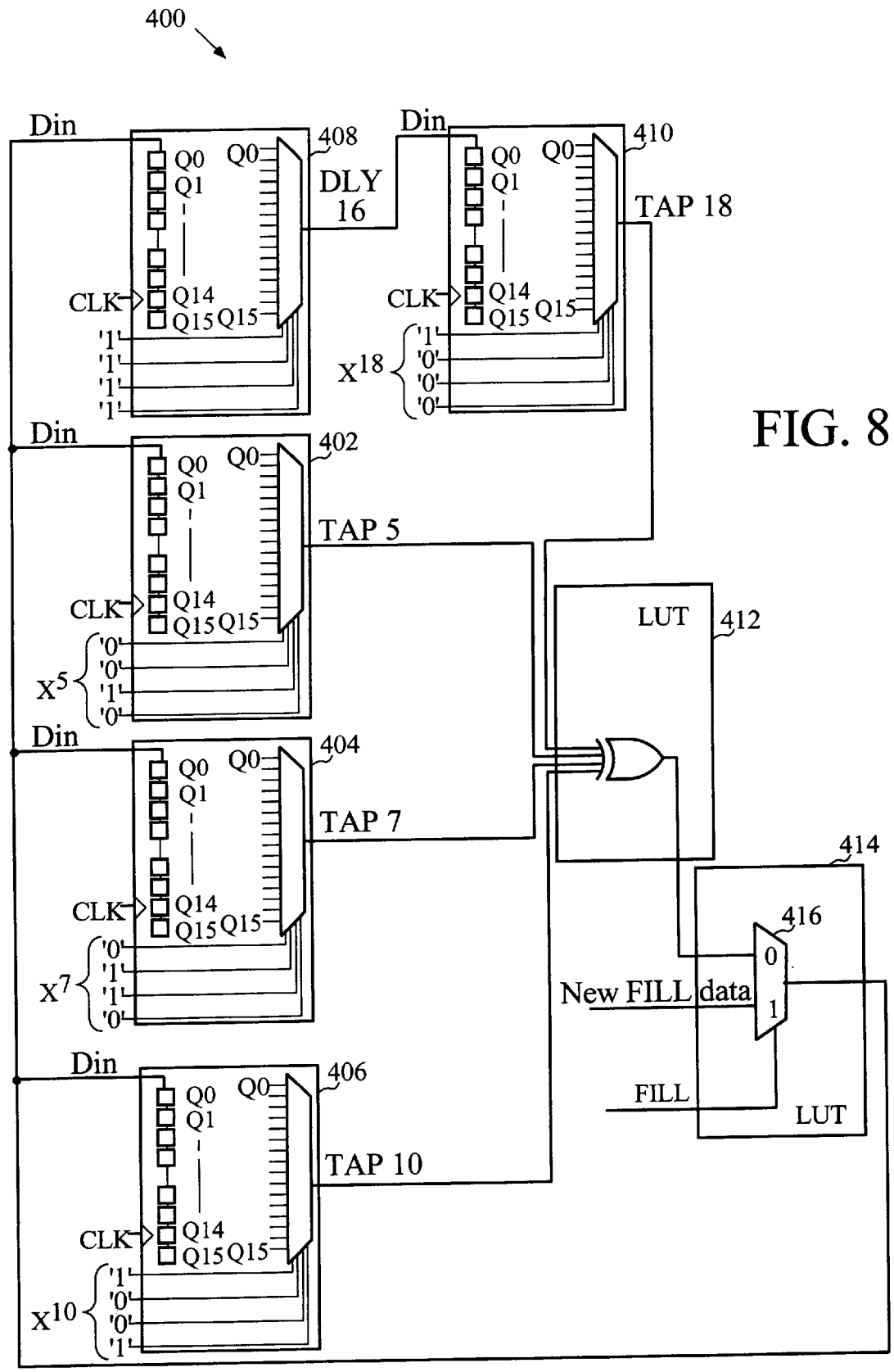
FIG. 8 is a block diagram of an LFSR that implements an example polynomial having a degree that is greater than 16.
Figure 9:
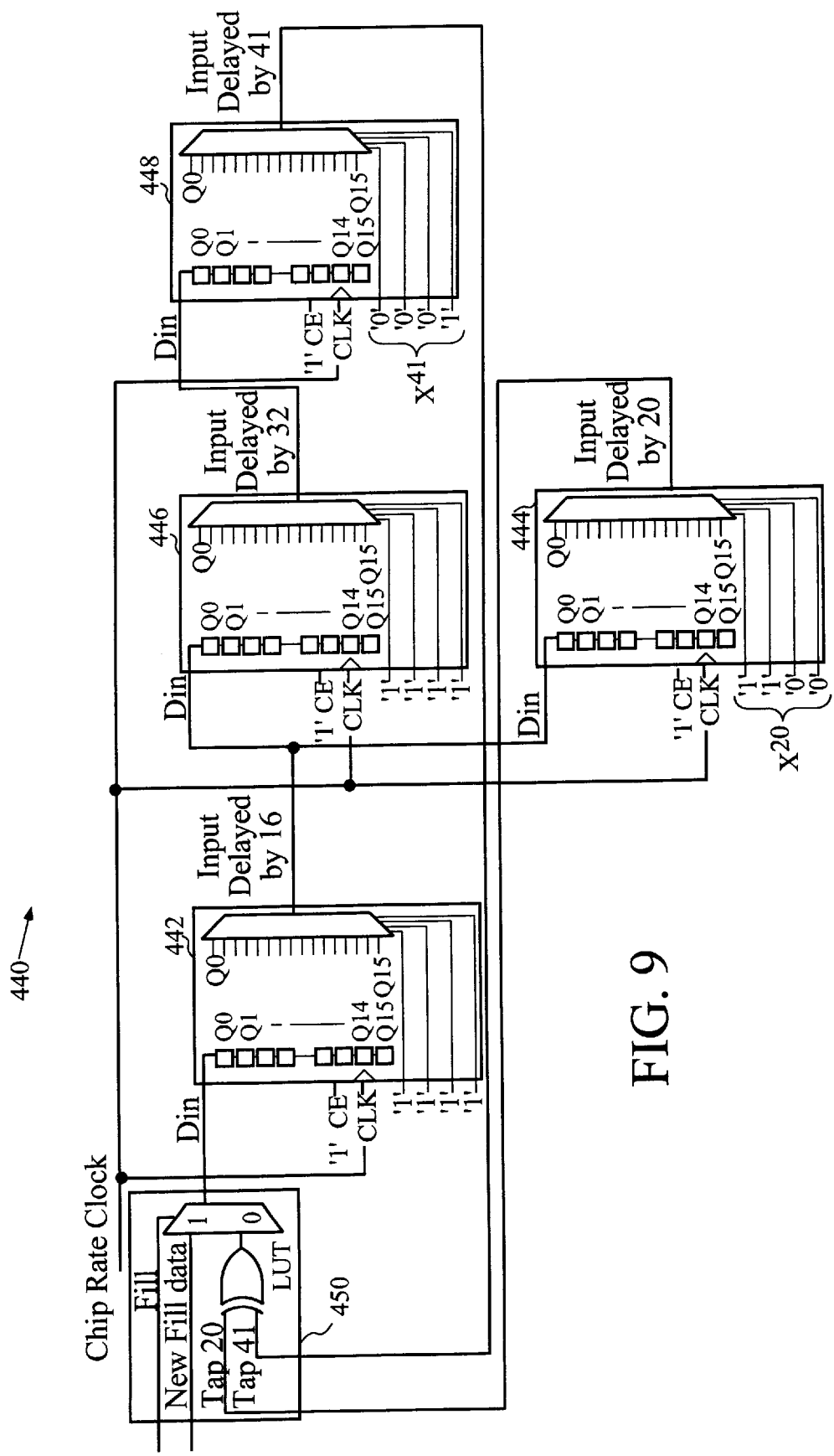
FIG. 9 is a block diagram of an example LFSR that implements an example polynomial having a degree of 41.
Figure 10:
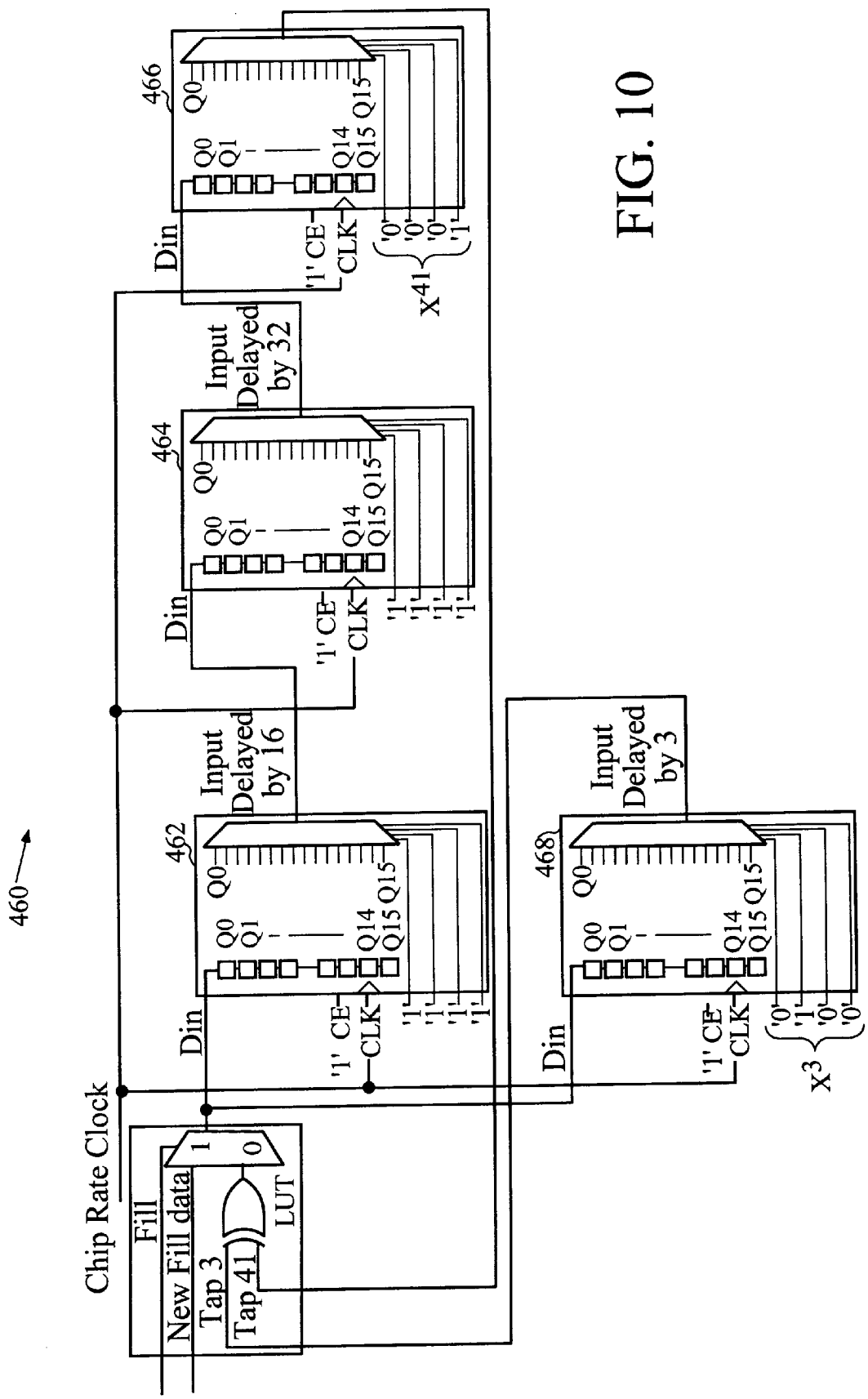
FIG. 10 is a block diagram of another example LFSR that implements a polynomial having a degree of 41.

In various other embodiments, the size of the shift register can be varied in accordance with application requirements. The example 16-stage shift register can be used for shift registers having up to 16 stages. Shift registers having more than 16 stages can be implemented using multiple 4-input LUTs, as shown in FIGS. 8–10, or using LUTs having more than 4 inputs. It will be appreciated that the illustrated embodiments could be varied using LUTs of sizes other than 4.

Figure 4:
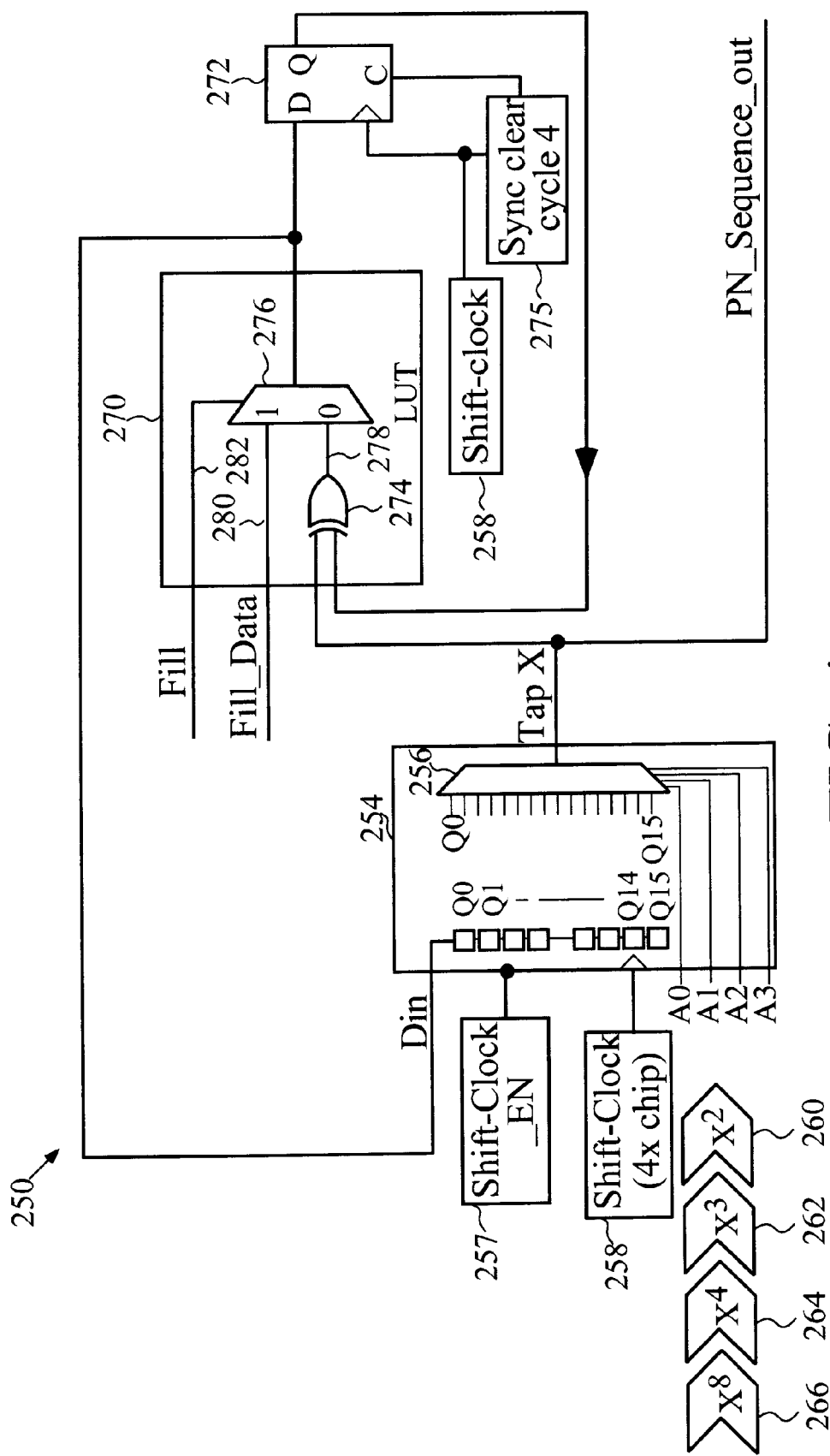
FIG. 4 is a block diagram of another embodiment of an LFSR implemented in a programmable gate array.

FIG. 4 is a block diagram of another embodiment of an LFSR 250 implemented in a programmable gate array. The embodiment includes a single instance of a shift register 254 implemented with a LUT and time-multiplexed selection signals applied to selection inputs of a multiplexer 256. The shift register receives and shifts data at a first clock rate as enabled by a shift-clock_EN signal generator 257, and multiplexer 256 asynchronously selects taps from the shift register at a rate determined by the address lines themselves, which is m× the first clock rate where m is the number of taps. For example, if the address lines were to toggle such that 7 unique addresses were presented to the multiplexer select lines during one period of the shift rate, then 7 taps would be accessed. This allows the LFSR to access m taps and therefrom generate parity for input to the shift register in one cycle of the first clock rate.

The signal provided by shift-clock 258 to LUT 254 is, for example, 4× the chip-rate. When the shift-clock_EN signal is a logic level 1 at the same time as a rising edge of the shift-clock 258 signal, the data in the shift register is shifted by one cell.

The example polynomial implemented by LFSR 250 of FIG. 4 is the same as the polynomial of FIG. 3. The sequence of directional blocks 260, 262, 264, and 266 represents the time multiplexing of 4 sets of selection signals, each set including the signals designated as A0, A1, A2, and A3. For example, block 260 represents the set of signals for selecting the $X^2$ term in a first timing interval, block 262 represents the set of signals for selecting the $X^3$ term in the second timing interval, block 264 selecting the $X^4$ term in the third interval, and block 266 selecting the $X^8$ term in the fourth interval.

Each of the sets of the selection signals addresses one of the taps Q0–Q15, and the multiplexer makes the selected data available on the output port tap x, where x is one of Q1, Q2, Q3, or Q7, for example. Before data is fed back into the shift register, parity must have been generated from all the desired taps. It will be appreciated that the $X^8$ tap must be accessed during the last stage of the multi-cycle read of the shift register since the last stage of the shift register is also the LFSR PN sequence output. The $X^2$, $X^3$, and $X^4$ taps can be accessed in any desired order.

LUT 270 implements an XOR function along with a fill-data function that is described later. The tap x signal is input to the XOR function, and the output of LUT 270 is coupled to the data input of a flip-flop 272. Flip-flop 272 is an FDRE-type flip-flip with synchronous reset and enable ports, for example, and has its data input clocked at the same rate at which multiplexer 256 is clocked to select a tap. FDRE flip-flops are provided in various XILINX FPGAs either as macros or as primitives. Output from the flip-flop is provided as the other input to the XOR function. Thus, flip-flop 272 provides an accumulation of the XORs of the taps.

Figure 7:
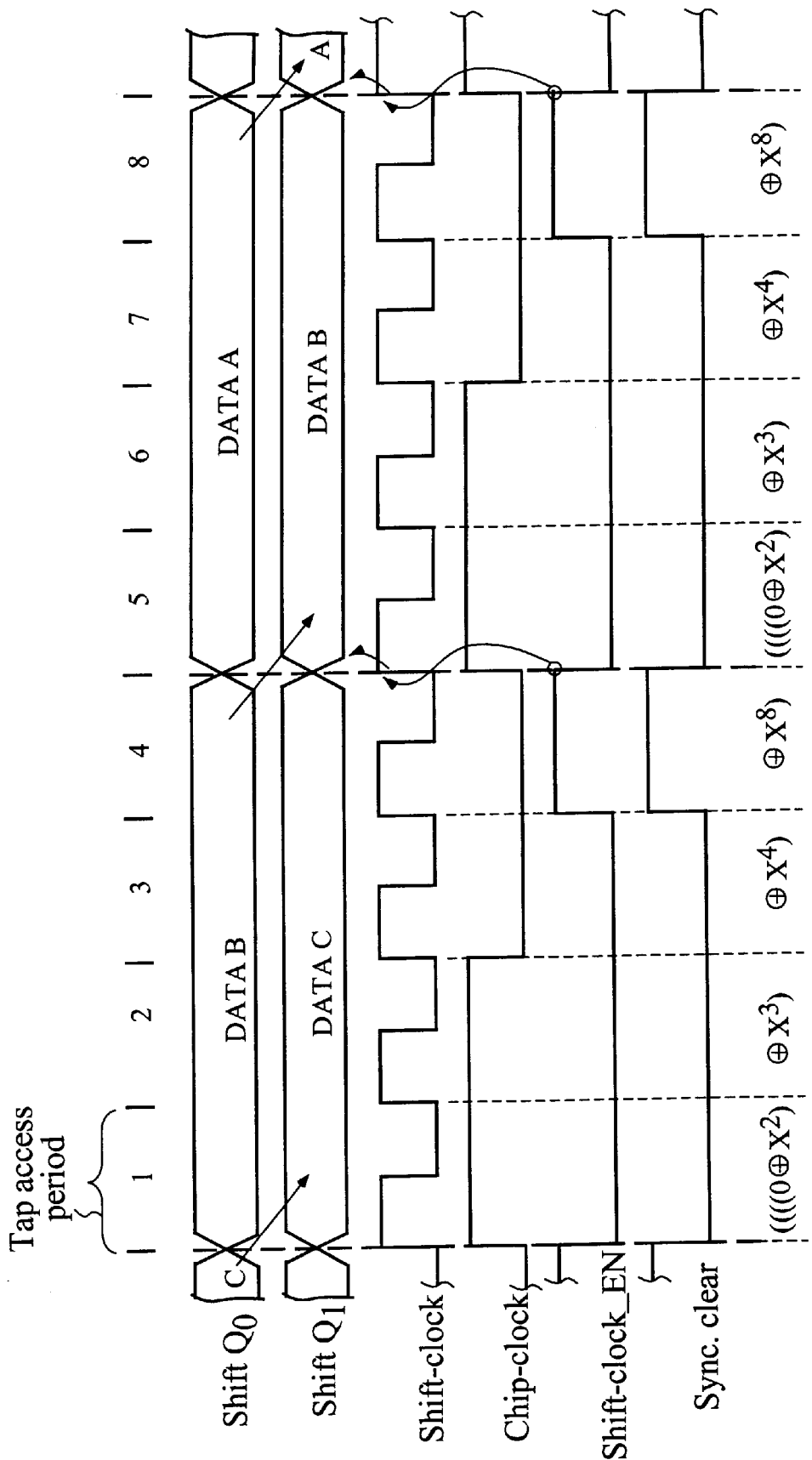
FIG. 7 is a timing diagram that illustrates time multiplexing output of selected stages of an LFSR implemented in accordance with the embodiment shown in FIG. 4.

Flip-flop 272 must be synchronously cleared during the last cycle of the shift-clock signal within each period of the shift-clock_EN signal so that the data in flip-flop 272 does not contribute to the generation of the next code beginning with the new period of the shift-clock_EN signal. Thus, shift-clock generator 258 is coupled to synchronous clear generator 275, which provides a clear-data signal to flip-flop 272 on the fourth cycle of the shift-clock signal within a period of the shift-clock_EN signal (FIG. 7 further illustrates the timing).

The output of LUT 270 is also coupled to the data input port of shift register 254. An enable signal applied at the clock enable port of the shift register enables loading of data from LUT 270 into the first bit of the shift register. This shift enable signal is active only during the last cycle of the shift enable signal that occurs during one shift period.

For access to an odd number of taps during one chip rate period, the multi-cycle clock can be a power-of-2 multiple of the chip rate, and the flip-flop can be clock enabled such that it is active for only as many clock cycles as there are taps to be accessed during the chip rate period. For example, to implement a polynomial with 3 feedback taps, the flip-flop could be clocked with a 4× chip rate clock, and only clock enabled for three of the cycles.

Various standards, such as the UMTS, require starting a new code generation at the boundary of a frame. In other words, the data in the shift register are reset periodically. The standards also specify that the shift register must be reset in one clock cycle (the "chip rate"), requiring parallel inputs to the stages of the shift registers in conventional implementations. A parallel input shift register can satisfy the requirement, but each flip-flop in the chain must receive input data from a 2:1 multiplexer that selects between shift data and fill data. Thus, many programmable gate array resources are required for such an LFSR.

Instead of providing parallel inputs to the stages of the shift register to comply with the standard, the example embodiment of the invention selects between fill data and generated parity data for input to the shift register. For example, if an 8-bit LFSR is implemented as shown in FIG. 4, during the last 8 clock cycles of a frame, fill data, instead of the parity generator output, is selected for input to the first stage of the shift register. This fills the shift register with the desired data without requiring parallel inputs to the shift register. As the 8 bits of new data are loading into the shift register during the last 8 cycles of the current sequence, the last 8 bits of the current sequence are being shifted out unaffected by the serial load. The last bit is shifted out coincident with the frame boundary and so the feedback loop is closed and the LFSR continues with generation of the new PN_sequence from the fill state.

LUT 270 implements the combination of XOR gate 274 and multiplexer 276, wherein the multiplexer selects between generated parity data on line 278 and fill data on line 280. The fill signal on line 282 that controls the selection can be driven by an external timer (not shown) that counts the number of cycles remaining until the end of a frame and activates the signal to select the fill data when j cycles remain until the end of the frame, where j is the number of stages in the LFSR.

It will be appreciated that the number of address lines required depends on the number and position of the taps. Inspection of the polynomial may reveal that one or more of the selection signals will remain in a fixed state for the required taps. For example, consider the polynomial:

$$g(x)=1+X^7+X^{16}$$

To address taps 7 and 16, the address signals are A0–A3="0110" and A0–A3="1111," respectively. It can be seen that only the A0 and A3 bits change state. Thus, bits A1 and A2 can be permanently wired to logic state "1." This reduces the need to implement addressing logic for the two middle address lines of multiplexer 256. Each of the address signals that changes state can be implemented with a dedicated shift register (the "addressing shift register") implemented with a LUT, for example, as described in the above referenced patent application. The addressing shift register can be initialized with a predetermined pattern to drive the selection inputs of multiplexer 256, thereby selecting the desired taps at a multiple of the shift-clock_EN rate (or chip-rate). The output of stage 16 of the addressing shift register is always selected as the output, and the addressing pattern is shifted at m× the rate at which data are shifted in the shift register 254.

The number of taps that can be implemented in the embodiment of FIG. 4 is dependent on the number of taps that can be selected by multiplexer 256 in each period of the shift-clock_EN signal. That is, the implementation must be capable of generating parity from all the selected taps of the shift register within one cycle of the shift-clock_EN signal.

In an example embodiment using the Virtex FPGA from XILINX, the SR pin of a Virtex slice can only be mapped to either the clock enable port of shift register 254 or to the synchronous reset port of flip-flop 272 (see particularly page 7 of the referenced Xilinx Web Site document). Therefore, in a Virtex FPGA, shift register 254 and flip-flop 272 cannot be mapped to the same slice. However, it will be appreciated that LFSR 250 can be mapped to two slices of a Virtex CLB. Specifically, the 4-LUT of one slice implements shift register 254, and the 4-LUT and flip flop of the other slice implement XOR gate 274, multiplexer 276, and flip-flop 272.

Figure 5:
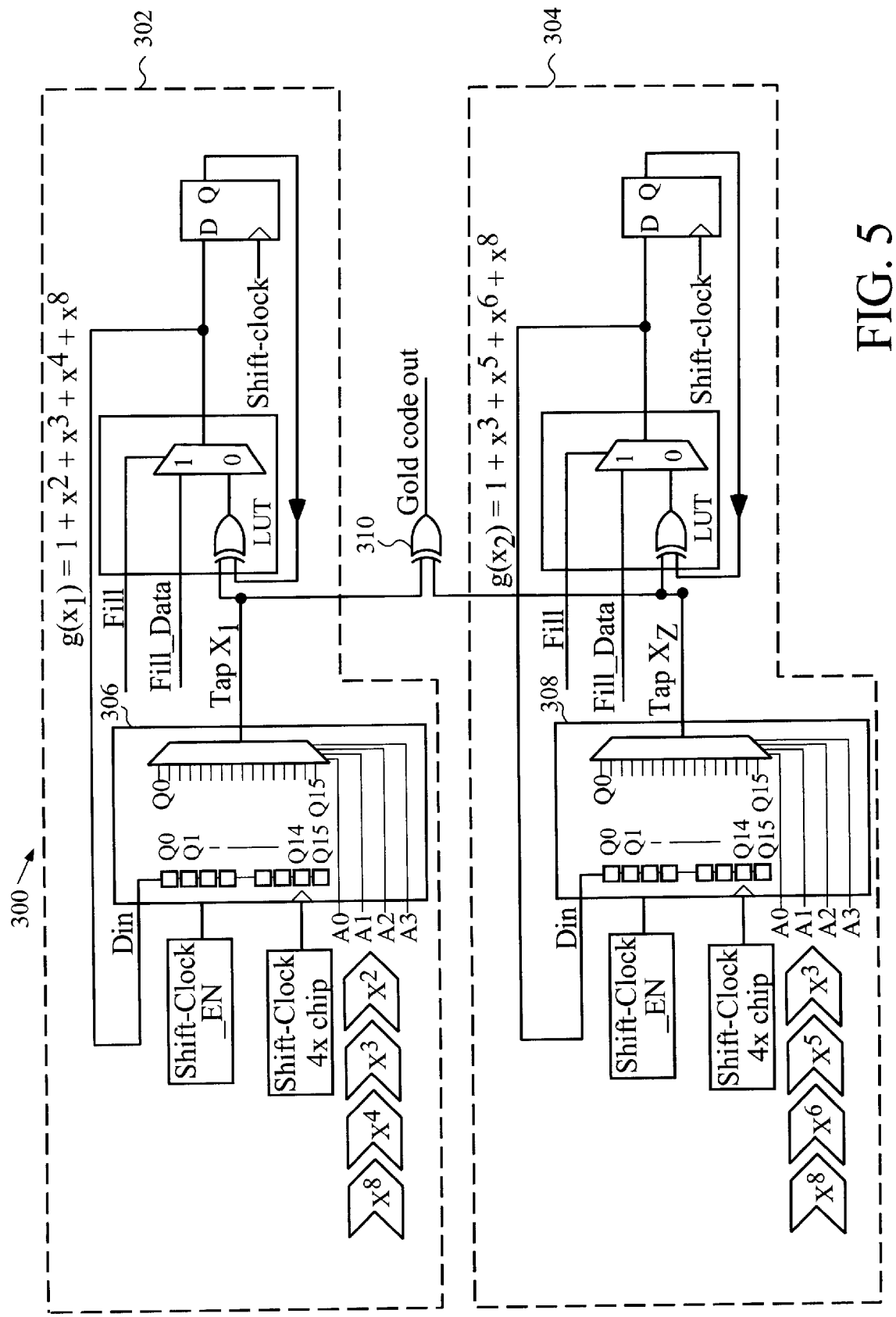
FIG. 5 is a block diagram of a pair of time-multiplexed, LUT-based LFSRs that are arranged to generate a Gold code in accordance with an example embodiment of the invention.

FIG. 5 is a block diagram of a pair of time-multiplexed, LUT-based LFSRs that are arranged to generate a Gold code in accordance with an example embodiment of the invention. Generally, Gold discovered that m-sequence sets with good cross-correlation properties could be created from pairs of selected m-sequences by XORing the m-sequences in a pair. Thus, a Gold-code generator is generally implemented with two LFSRs having the same length, and outputs of the two LFSRs are XORed.

Gold-code generator 300 includes two LFSRs 302 and 304, each of which is constructed as shown in the LFSR embodiment of FIG. 4. The tap $x_1$ and tap $x_2$ outputs of shift registers 306 and 308 are provided as inputs to XOR gate 310. It will be appreciated that the XOR gate can be implemented with a programmable gate array LUT, for example. LFSR 302 implements an example polynomial $$g(x_1)=1+X^2+X^3+X^4+X^8,$$

and LFSR 304 implements the polynomial $$g(x_2)=1+X^3+X^5+X^6+X^8.$$

Figure 6:
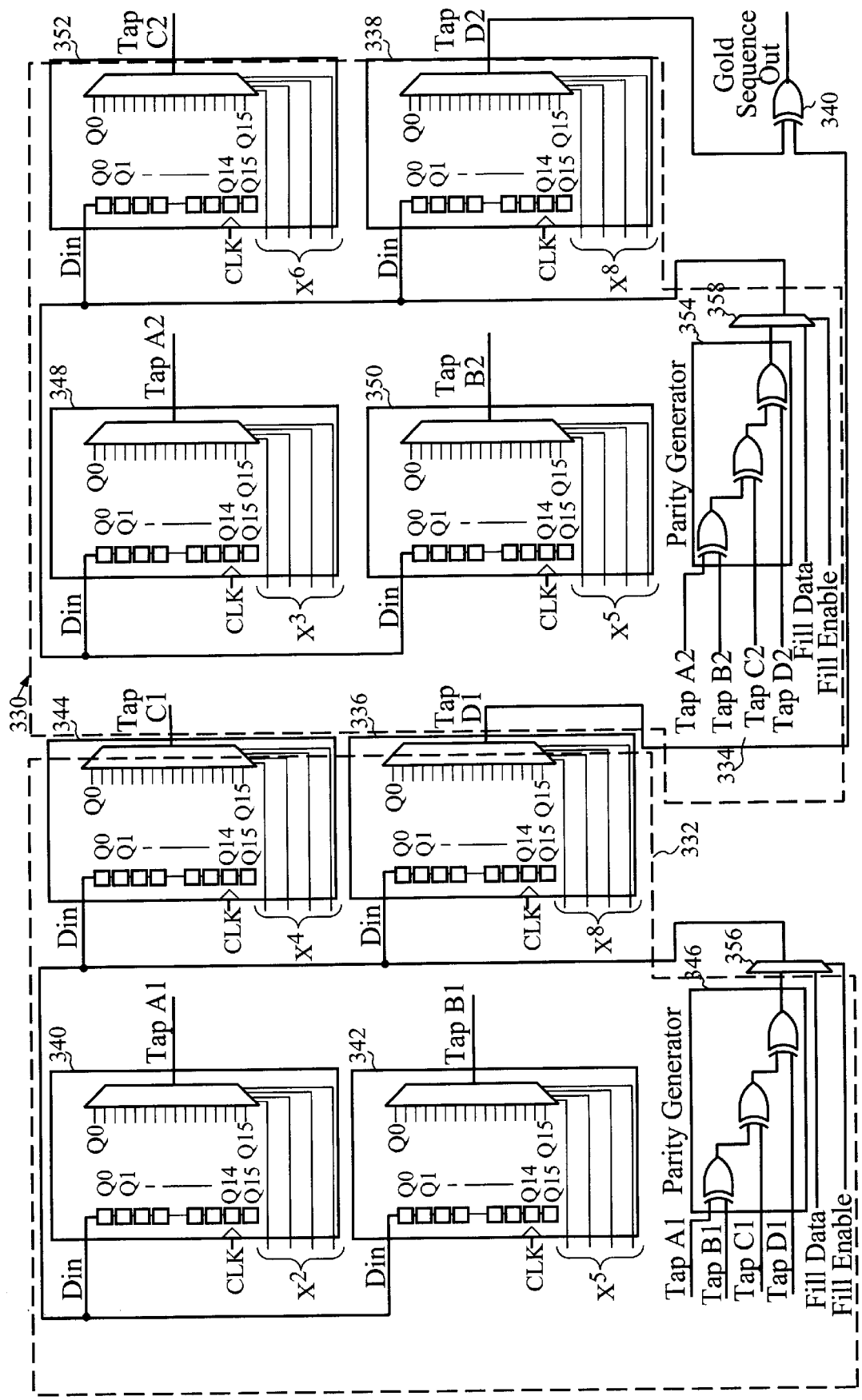
FIG. 6 is a block diagram of a Gold-code generator in accordance with another example embodiment of the invention.

FIG. 6 is a block diagram of a Gold-code generator in accordance with another example embodiment of the invention. The Gold-code generator 330 includes two LFSRs 332 and 334, each of which is constructed similar to the LFSR embodiment shown in FIG. 3. The tap D1 and tap D2 outputs of shift registers 336 and 338 are provided as inputs to XOR gate 340, and the output of the XOR gate is the Gold-code.

Shift registers 340, 342, 344, and 336 and parity generator 346 implement the example polynomial $$g(x_1)=1+X^2+X^3+X^4+x^8,$$

and shift registers 348, 350, 352, and 338 and parity generator 354 implement the example polynomial $$g(x_2)=1+X^3+X^5+X^6+X^8.$$

It will be appreciated that LFSRs 332 and 334 also include respective multiplexers 356 and 358 that select between output of parity generators 346 and 354 and fill data. The selected data is provided as input to the first stages of shift registers 340, 342, 344, and 336 and 348, 350, 352, and 338, respectively.

FIG. 7 is a waveform diagram that illustrates time multiplexing output of selected stages of an LFSR implemented in accordance with the embodiment shown in FIG. 4. The shift-clock signal has a frequency that is 4× the rate of the chip-clock; the chip-clock signal has a frequency that is referenced as the "chip rate"; and the shift-clock_EN signal has a frequency that drives shifting of data in the shift register. The frequency of the chip-clock and the shift-clock_EN signals are the same. Thus, the shift-clock signal has a frequency that is also 4× that of the shift-clock_EN signal. When the shift-clock_EN signal is logic level 1 at the same time as a rising edge of the shift-clock signal, the data in the shift register is shifted by one memory cell, as indicated by the movements of data C, B, and A through stages shift Q0 and Q1.

The example shift-clock signal having a frequency that is 4× that of the shift-clock_EN signal supports up to four taps to be selected in each cycle of the shift-clock. Relative to the parity generation of the example polynomial $$g(x)=1+X^2+X^3+X^4+X^8,$$

the signal (0 XOR $X^2$) is generated during interval 1, the result of interval 1 is XOR'd with $X^3$ in interval 2, the result of interval 2 is XOR'd with $X^4$ in interval 3, and the result of interval 3 is XOR'd with $X^8$ in interval 4 to produce the final parity generation output. It will be appreciated that the final parity generation output of interval 4 coincides with the active state of the shift-clock so that the data can be input to the first stage of the shift register.

FIG. 8 is a block diagram of an LFSR that implements an example polynomial having a degree that is greater than 16. Polynomials having degree greater than 16 generally support long scrambling codes. The example polynomial of LFSR 400 is:

$$g(x)=1+x^5+x^7+x^{10}+x^{18}.$$

LFSR 400 is implemented with shift registers 402, 404, 406, 408, and 410 and with a first LUT 412 that implements the XOR of the selected taps and a second LUT 414 that implements multiplexer 416 to select between the parity data and the new fill data. Shift registers 402–406 are implemented in accordance with the example embodiment shown in FIG. 3.

Shift registers 408 and 410 implement selection of the $x^{18}$ term of the polynomial. The selection signals for shift register 408 are always set to "1111" to select the last stage Q15 for input to the first stage of shift register 410. The $x^{18}$ term of the polynomial is selected from tap Q1 of shift register 410 with the selections bits "0001."

Figure 11:
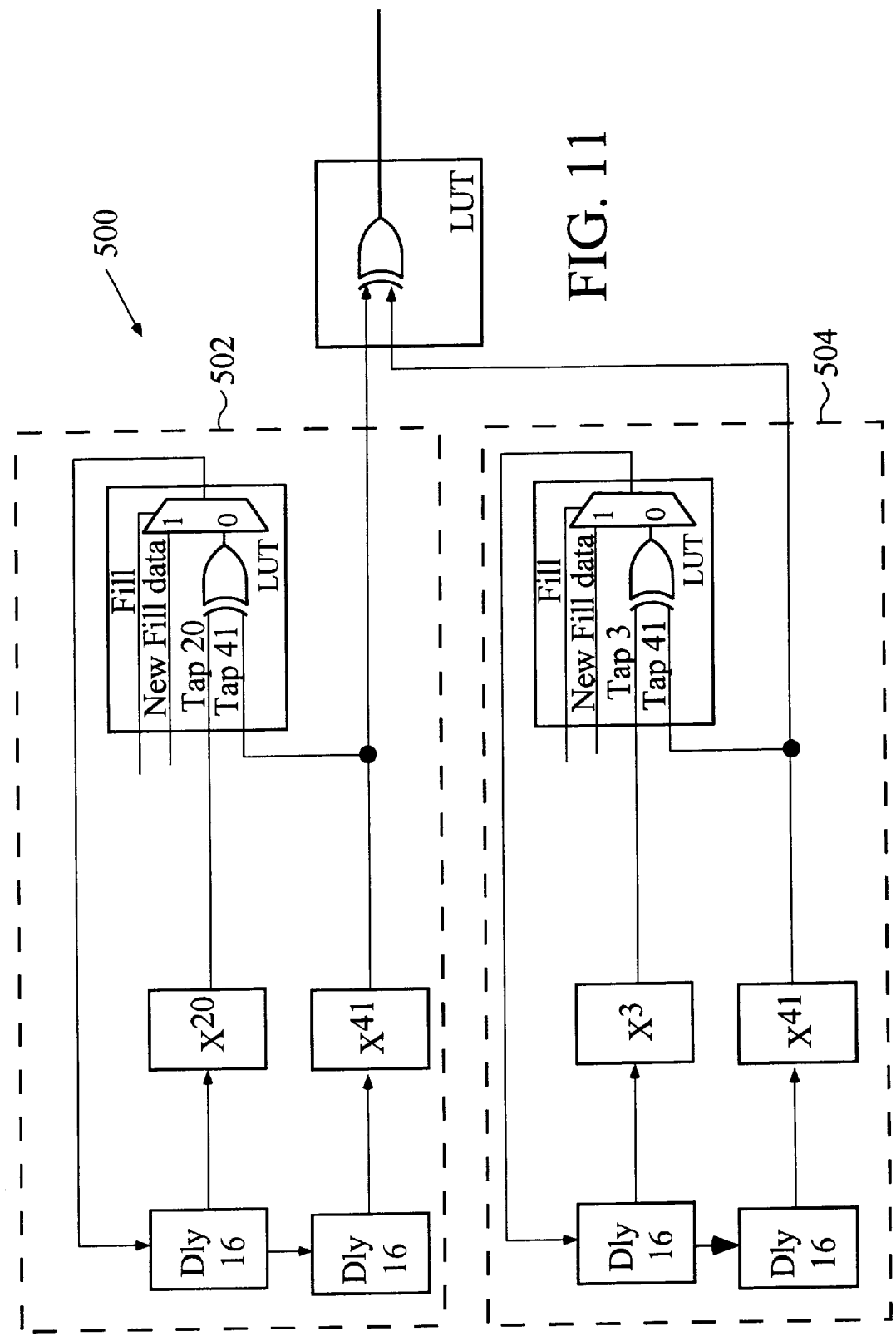
FIG. 11 is block diagram of an example long scrambling code generator having two LFSRs that implement 41-degree polynomials.

The UMTS specification sets forth generation of scrambling codes using a pair of 41-stage LFSRs having their outputs XORed. FIGS. 9 and 10 illustrate two 41-stage LFSRs, respectively, and FIG. 11 illustrates a Gold code generator implemented with the two 41-stage LFSRs.

FIG. 9 is a block diagram of an LFSR 440 that implements an example polynomial having a degree of 41. The example polynomial is:

$$g(x)=1+x^{20}+x^{41}.$$

LFSR 440 is implemented with shift registers 442, 444, 446, and 448 and with a single LUT 450 that implements the combined functions of the parity generator and fill data selection.

Shift registers 442 and 444 implement the $x^{20}$ tap, and shift registers 442, 446, and 448 implement the $x^{41}$ tap. Stages 1–16 are provided by shift register 442, and the selected output is always the 16th stage, i.e., tap Q15. The output of shift register 442 is provided as input to both shift registers 444 and 446. Tap 20 (Q3 of shift register 444) is selected with selection bits "0011" for the $x^{20}$ term, and the output is provided as input to XOR function provided by LUT 450.

Shift register 446 implements stages 17–32 of the 41-stage shift register, and tap 32 is always selected for input to the first stage of shift register 448. Thus, shift registers 442 and 446 together implement stages 1–32, and stages 33–41 are provided by shift register 448. Tap 41 is provided by Q8 of shift register 448 and is selected for input to the XOR function implemented by LUT 450.

FIG. 10 is a block diagram of an LFSR 460 that implements an example polynomial having a degree of 41. The example polynomial is:

$$g(x)+1x^3+x^{41}.$$

The implementation of LFSR 460 is similar to the implementation of LFSR 440 (FIG. 9), and shift registers 462, 464, and 466 implement stages 1–41 of LFSR, as explained in the discussion accompanying FIG. 9. Shift register 468 implements the first 16 stages of LFSR 460 and selects Q2 of shift register 468 as the $x^3$ term.

FIG. 11 is block diagram of an example long scrambling code generator 500 having two LFSRs 502 and 504 that implement 41-degree polynomials. The generator 500 may be used, for example, in a UMTS based system. In an example embodiment, LFSRs 502 and 504 can be implemented in accordance with LFSRs 440 and 460 of FIGS. 9 and 10, respectively. The generator 500 is serially loaded with new FILL data in 41 chip-rate cycles prior to a frame boundary.

It will be appreciated that polynomials of degree greater than 16 and having more than 2 taps can be implemented in accordance with the teachings set forth above.

Figure 12:
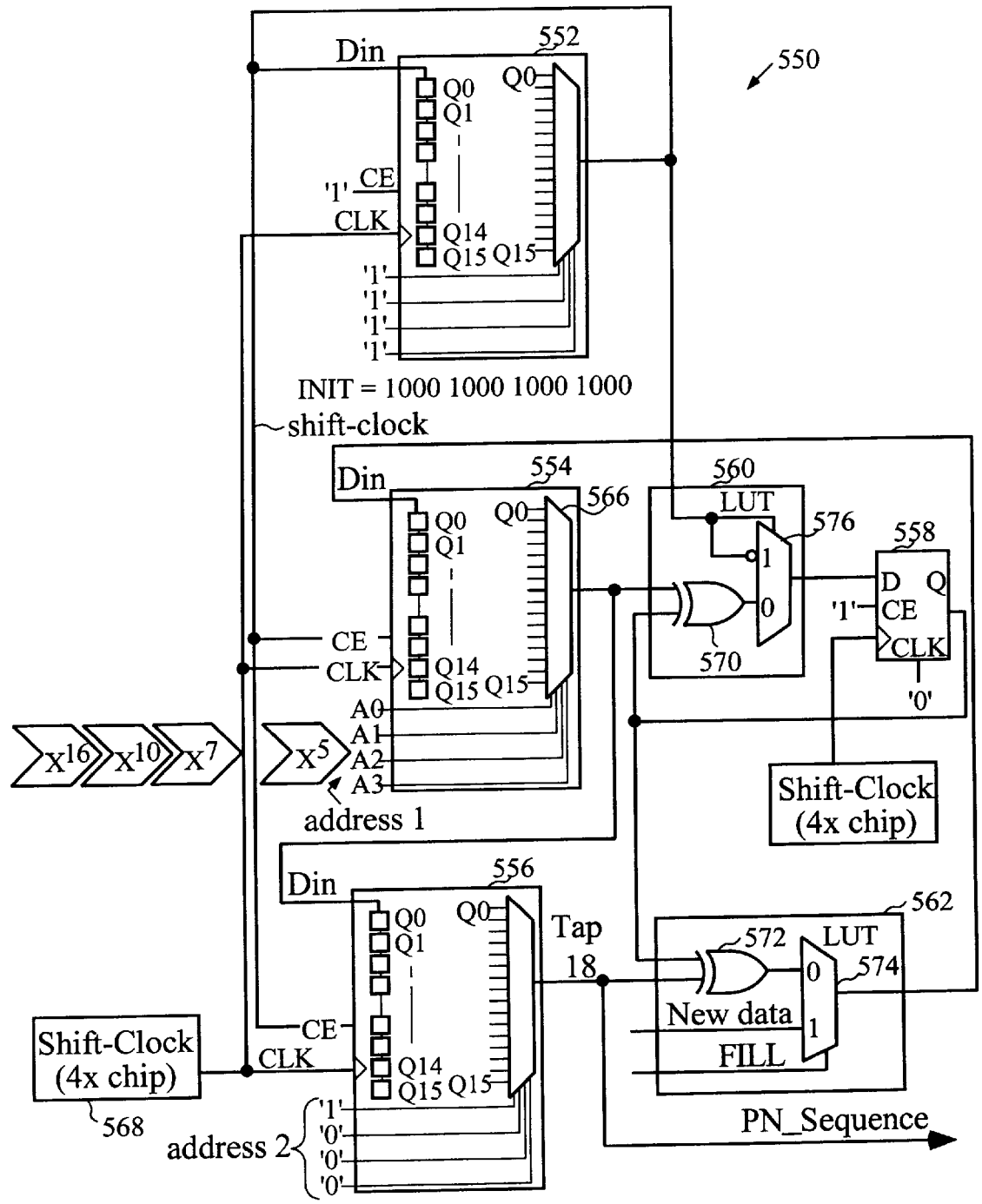
FIG. 12 is a block diagram of an LFSR that implements a polynomial of degree greater than 16 with time-multiplexed selection of taps of the shift register in accordance with an example embodiment of the invention.

FIG. 12 is a block diagram of an LFSR that implements a polynomial of degree greater than 16 with time-multiplexed selection of taps of the shift register in accordance with an example embodiment of the invention. LFSR 550 implements the example polynomial:

$$g(x)=1+x^5+x^7+x^{10}+x^{18}$$

Given the example polynomial and implementation, those skilled in the art will recognize how larger LFSRs could be implemented.

LFSR 550 includes shift registers 552, 554, and 556 implemented with LUTs as described above. Logical taps 1–16 of LFSR 550 are available from shift register 554, and logical taps 17 and 18 are available from shift register 556. Generally, shift registers 554 and 556 are used to generate the taps for the polynomial, and shift register 552 is used to periodically reset flip-flop 558. A partial generation of parity for the polynomial is implemented with shift register 554 and LUT 560, and the final parity is generated with shift register 556 and LUT 562. Specifically, parity is generated from taps 5, 7, and 10 of shift register 554, and therewith, parity is generated from logical tap 18 as provided by shift register 556.

The address 1 selection inputs to multiplexer 566 are time multiplexed as indicated by the directional blocks labeled $x^5$, $x^7$, $x^{10}$, and $x^{16}$. The $x^5$ inputs cause multiplexer 566 to select tap 5, the $x^7$ inputs cause multiplexer 566 to select tap 7, and the $x^{10}$ inputs cause multiplexer to select tap 10. Every fourth cycle of the signal from shift-clock 568, stage 16 of shift register 554 is selected, as indicated by the block $x^{16}$, and provided as the data input to shift register 556. It will be appreciated that the pattern from shift register 552 provides the clock-enable signal CE for shift registers 554 and 556. Thus, when stage 16 is selected for output from shift register 554, shift register 556 is enabled by the signal from shift register 552 to shift data in from shift register 554.

The time-multiplexed taps from shift register 554 are provided as input to XOR gate 570 which is implemented by LUT 560. The other input to XOR gate 570 is provided by FDCE flip-flop 558. FDCE flip-flops are available in XILINX FPGAs, for example. Flip-flop 558 is initially set to 0, and tap 5 of the LFSR is therefore XORed with 0. For the example polynomial, the flip-flop accumulates the parity of taps 5, 7, and 10 and provides the accumulated parity as input to XOR gate 572, which is implemented with LUT 562. Tap 18 of LFSR 550 is provided as the other input to XOR gate 572, which generates the data that is fed-back to stage 1 of shift register 554. It can be seen that LUT 562 also implements multiplexer 574 that provides the fill-data function as described above.

LUT 560 also implements a multiplexer 576 that selects between output from XOR gate 570 and inverted output from shift register 552. Multiplexer 576 and shift register 552 together provide the clearing function for flip-flop 558. Recall that flip-flop 558 must be cleared every fourth cycle since tap 5 must be XOR'd with 0. The initial pattern programmed in shift register 552 provides both data and selection signals for multiplexer 576. Thus, for the example pattern 1000 (output from shift register 552 right-to-left), the 0 data input of multiplexer 576 is selected until the bit having a logic level 1 is provided. The logic level 1 at the selection input of multiplexer 576 causes selection at the 1-data input, which is logic level 0 (inverted logic level 1). Flip-flop 558 is always clock- enabled with logic level 1 and has its CLR port grounded.

Figure 13:
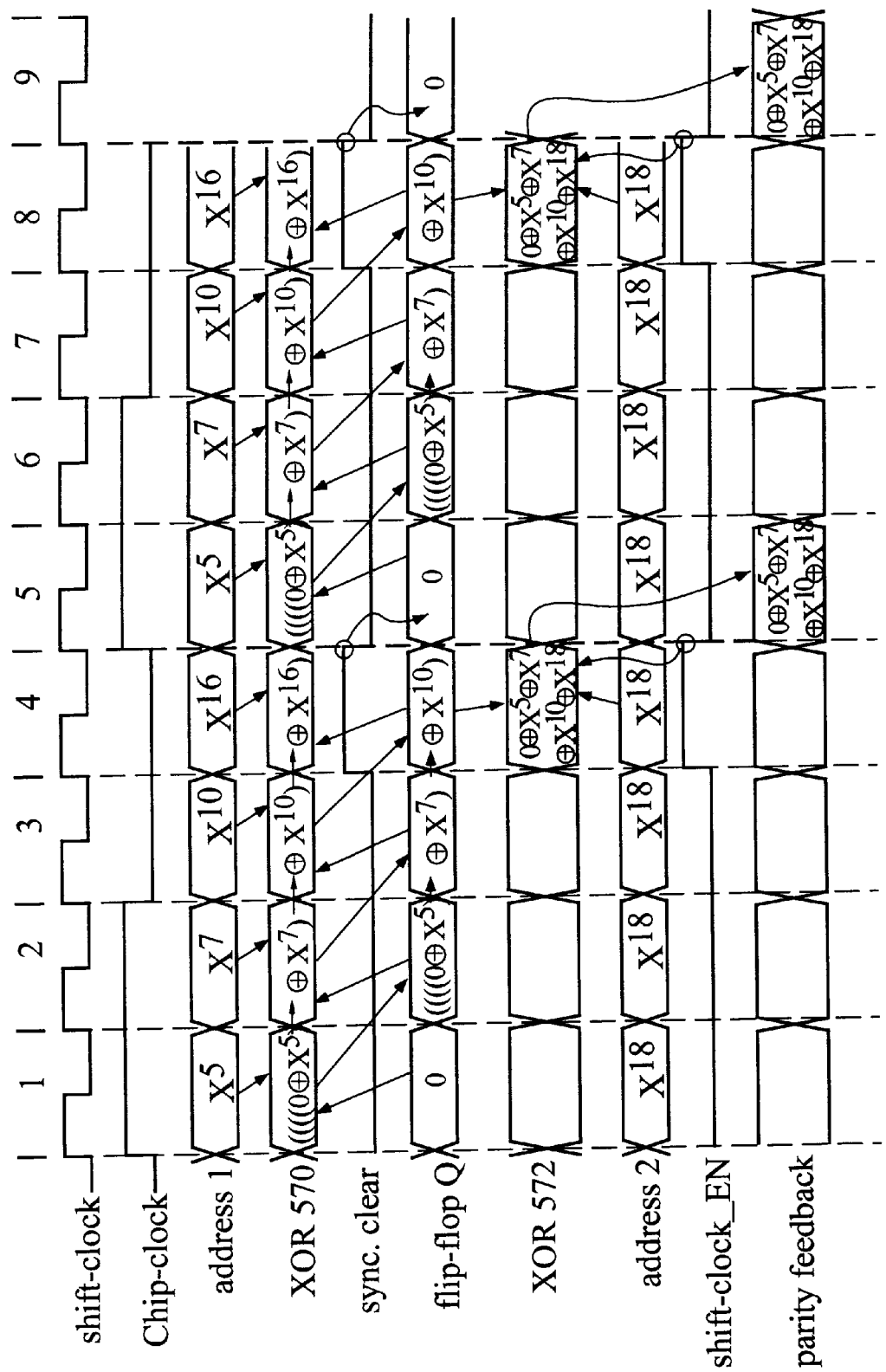
FIG. 13 is a waveform diagram that describes the operation of the LFSR of FIG. 12.

FIG. 13 is a waveform diagram that describes the operation of LFSR 550 of FIG. 12. Address 1 is provided by four LUT-implemented shift registers (not shown) cycling through initialized patterns to provide addresses for taps 5, 7, 10, and 16. The Q output of flip-flop 558 has logic level 0 at its output during interval 1. Also during interval 1, tap 5 of shift register 554 is selected and XORed by XOR gate 570 with output from flip-flop 558. Flip-flop 558 stores the XOR result and feeds back the data during interval 2. During interval 2, the selection bits are changed to select tap 7, and tap 7 is XORed with the result from interval 1 to produce a new partial parity result, $0 \text{ XOR } X^5 \text{ XOR } x^7$, which is stored in flip-flop 558 and available in interval 3. The partial parity result, $0 \text{ XOR } x^5 \text{ XOR } x^7 \text{ XOR } x^{10}$ is generated in interval 3 and stored in flip-flop 558.

During interval 4, shift register 552 is outputting logic level 1 as part of its cyclic pattern, which clears flip-flop 558 and ignores the output of XOR gate 570. Thus, logic level 0 is again available in interval 5 to repeat the partial parity generation for: $0 \text{ XOR } X^5 \text{ XOR } x^7 \text{ XOR } x^{10}$.

Before flip-flop 558 is cleared, output of the flip-flop is available in interval 4 for XORing with tap 18 by XOR gate 572. The output, $(0 \text{ XOR } x^5 \text{ XOR } x^7 \text{ XOR } x^{10} \text{ XOR } x^8)$, of XOR gate 572 is fed back to the input of shift register 554, which is enabled by shift register 552 during interval 4.

Accordingly, the present invention provides, among other aspects, an LFSR implemented in a programmable gate array in a manner that makes efficient use of the programmable resources. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A linear feedback shift register in a programmable gate array, comprising:
    a first lookup table configured as a shift register having n selectable taps and a shift-input, wherein n is an integer; and
    a second lookup table configured as a parity generator having inputs coupled to the n selectable taps and an output coupled to the shift-input shift register.

2. The linear feedback shift register of claim 1, wherein:
    the first lookup table also implements a multiplexer having an output and inputs coupled to the n selectable taps, and the shift register operable at a shift frequency at which data are shifted responsive to a first clock frequency, and the n taps are selectable at a select-frequency responsive to a second clock frequency that is m× the first clock frequency, wherein m is an integer; and
    the second lookup table is configured as an XOR function generator having at least two inputs and an output, wherein one of the inputs is coupled to the output of the multiplexer; and further comprising a flip-flop having a data input coupled to the output of the parity generator, an output coupled to an input of the XOR function generator, and clocked at the second clock frequency.

3. The linear feedback shift register of claim 2, wherein the second lookup table is further configured as a multiplexer having inputs coupled to receive reset-data and to the output of the XOR function generator, a selector input, and an output coupled to the data input of the shift register.

4. The linear feedback shift register of claim 1, further comprising a multiplexer having inputs coupled to receive reset-data and to the output of the XOR function generator, a selector input, and an output coupled to the data input of the shift register.

5. The linear feedback shift register of claim 1 having n-stages and m taps, further comprising a plurality of lookup tables, each implementing a respective shift register coupled to a respective n:1 multiplexer and having a shift input coupled to the output of the parity generator, wherein a total of m lookup tables implement the shift registers and multiplexers, wherein m is an integer.

6. The linear feedback shift register of claim 5, wherein the n:1 multiplexers have respective sets of selection inputs coupled to a plurality of programmable selection elements.

7. The linear feedback shift register of claim 5, wherein the second lookup table is configured to generate an XOR function of the m taps.

8. The linear feedback shift register of claim 5, further comprising a multiplexer having inputs coupled to receive reset-data and to the output of the parity generator, a selector input, and an output coupled to the data inputs of the shift registers.

9. The linear feedback shift register of claim 1, wherein the first lookup table comprises:
    a plurality of memory cells, each having a respective input and output, wherein the input of a first one of the memory cells is coupled to the output of the parity generator, and the memory cells are serially coupled one to another; and
    a multiplexer coupled to outputs of the memory cells.

10. The linear feedback shift register of claim 9, wherein the serial coupling of the memory cells is programmable.

11. An n-stage linear feedback shift register with m taps in a programmable gate array, comprising:
    m n-stage shift registers, each shift register having n outputs and a respective data input, wherein m and n are integers;
    m n:1 multiplexers having data inputs respectively coupled to the outputs of the n-stage shift registers, each multiplexer having log n selection inputs, wherein the shift registers and multiplexers are implemented with respective look-up tables in the programmable gate array; and
    a parity generator having inputs coupled to outputs of the multiplexers and having an output coupled to the data inputs of the shift registers.

12. The linear feedback shift register of claim 11, further comprising a plurality of programmable selection elements coupled to respective ones of the selection inputs of the multiplexers.

13. The linear feedback shift register of claim 12, further comprising a multiplexer having a first input coupled to receive output of the parity generator, a second input coupled to receive reset-data, a selector input, and an output coupled to the data inputs of the shift registers.

14. The linear feedback shift register of claim 11, further comprising a multiplexer having a first input coupled to receive output of the parity generator, a second input coupled to receive reset-data, a selector input, and an output coupled to the data inputs of the shift registers.

15. An n-stage linear feedback shift register with m taps in a programmable gate array, wherein n and m are integers, comprising:
    an n-stage shift register having n outputs, a data input, and operable at a first frequency at which data are shifted responsive to a first clock frequency;
    an n:1 multiplexer having data inputs respectively coupled to the outputs of the shift register, log n selection inputs, and operable at a second frequency at which the inputs are selectable responsive to a second clock frequency that is m× the first clock frequency, the shift register and multiplexer implemented with a look-up table in the programmable gate array;
    a lookup table configured as an XOR function generator and having a first input coupled to output of the multiplexer, a second input, and an output coupled to the data input of the shift register; and
    a flip-flop having a data input coupled to the output of the XOR function generator, an output coupled to the second input of the XOR function generator, and clocked at the second clock frequency.

16. The linear feedback shift register of claim 15, further comprising a multiplexer having a first input coupled to receive output of the XOR function generator, a second input coupled to receive reset-data, a selector input, and an output coupled to the data inputs of the shift registers.

17. A Gold-code generator comprising:
    a first set of $m_1$ n-stage shift registers, each shift register having n outputs and a respective data input, wherein $m_1$ and n are integers;
    a first set of $m_1$ n:1 multiplexers having data inputs respectively coupled to the outputs of the n-stage shift registers, each multiplexer having log n selection inputs, wherein the first sets of shift registers and multiplexers implemented with respective look-up tables in the programmable gate array; and
    a first parity generator having inputs coupled to outputs of the first set of multiplexers and having an output coupled to the data inputs of the first set of shift registers;
    a second set of $m_2$ n-stage shift registers, each shift register having n outputs and a respective data input, wherein $m_2$ is an integer;
    a second set of $m_2$ n:1 multiplexers having data inputs respectively coupled to the outputs of the second set of n-stage shift registers, each multiplexer having log n selection inputs, wherein the second sets of shift registers and multiplexers are implemented with respective look-up tables in the programmable gate array;
    a second parity generator having inputs coupled to outputs of the second set of multiplexers and having an output coupled to the data inputs of the second set of shift registers; and
    an XOR gate having a first input coupled to an output of one of the first set of n:1 multiplexers, a second input coupled to an output of one of the second set of n:1 multiplexers and an output that provides the Gold-code.

18. The Gold-code generator of claim 17, further comprising:
    a first multiplexer having a first input coupled to receive output of the first parity generator, a second input coupled to receive reset-data, a selector input, and an output coupled to the data inputs of the first set of shift registers; and
    a second multiplexer having a first input coupled to receive output of the second parity generator, a second input coupled to the receive reset-data, a selector input, and an output coupled to the data inputs of the second set of shift registers.

19. The Gold-code generator of claim 18, further comprising:
    a third multiplexer having a first input coupled to receive output of the XOR function generator, a second input coupled to receive reset-data, a selector input, and an output coupled to the data input of the first shift register; and
    a fourth multiplexer having a first input coupled to receive output of the second XOR function generator, a second input coupled to receive reset-data, a selector input, and an output coupled to the data input of the first shift register.

20. A Gold-code generator, where $m_1$, $m_2$, and n are integers, comprising:
    a first n-stage shift register having n outputs, a data input, and a first frequency at which data are shifted responsive to a first clock frequency, wherein n is an integer;
    a first n:1 multiplexer having data inputs respectively coupled to the outputs of the shift register, log n selection inputs, and a second frequency at which the inputs are selectable responsive to a second clock frequency that is $m_1$× the first clock frequency, the shift register and multiplexer implemented with a first look-up table in the programmable gate array, wherein $m_1$ is an integer;
    a second lookup table configured as an XOR function generator and having a first input coupled to output of the multiplexer, a second input, and an output coupled to the data input of the first shift register;
    a first flip-flop having a data input coupled to the output of the second lookup table, an output coupled to the second input of the second lookup table, and clocked at the second clock frequency;
    a second n-stage shift register having n outputs, a data input, and a first frequency at which data are shifted responsive to the first clock frequency;
    a second n:1 multiplexer having data inputs respectively coupled to the outputs of the second shift register, log n selection inputs, and a third frequency at which the inputs are selectable responsive to a second clock frequency that is $m_2$× the first clock frequency, the second shift register and second multiplexer implemented with a third look-up table in the programmable gate array, wherein $m_2$ is an integer;
    a fourth lookup table configured as an XOR function generator and having a first input coupled to output of the second multiplexer, a second input, and an output coupled to the data input of the second shift register;
    a second flip-flop having a data input coupled to the output of the fourth lookup table, an output coupled to the second input of the fourth lookup table, and clocked at the second clock frequency; and
    an XOR gate having inputs coupled to the outputs of the first and second multiplexers and an output that provides the Gold-code.

* * * * *